(12) United States Patent
Jin

(10) Patent No.: US 7,463,081 B2
(45) Date of Patent: Dec. 9, 2008

(54) INTERNAL VOLTAGE GENERATOR AND INTERNAL CLOCK GENERATOR INCLUDING THE SAME, AND INTERNAL VOLTAGE GENERATING METHOD THEREOF

(75) Inventor: Seung Eon Jin, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 97 days.

(21) Appl. No.: 11/490,241

(22) Filed: Jul. 21, 2006

(65) Prior Publication Data

US 2007/0013420 A1    Jan. 18, 2007

(30) Foreign Application Priority Data

Dec. 7, 2005    (KR) ............... 10-2005-0118976

(51) Int. Cl.
G05F 1/10    (2006.01)
(52) U.S. Cl. ............... 327/540; 327/73; 327/530
(58) Field of Classification Search ............... None
See application file for complete search history.

(56) References Cited

U.S. PATENT DOCUMENTS

| | | | |
|---|---|---|---|
| 6,101,137 A * | 8/2000 | Roh ............... | 365/194 |
| 6,266,294 B1 | 7/2001 | Yada et al. ............... | 365/233 |
| 6,313,694 B1 * | 11/2001 | Sohn ............... | 327/541 |
| 6,570,367 B2 * | 5/2003 | Bartenschlager et al. .... | 323/269 |
| 6,870,416 B2 * | 3/2005 | Cho ............... | 327/299 |
| 6,998,903 B2 * | 2/2006 | Jin ............... | 327/541 |
| 7,095,273 B2 * | 8/2006 | Sato et al. ............... | 327/543 |
| 7,177,206 B2 * | 2/2007 | Lee ............... | 365/194 |

FOREIGN PATENT DOCUMENTS

| | | |
|---|---|---|
| KR | 1999-0075064 | 10/1999 |
| KR | 1020000002777 | 1/2000 |
| KR | 1020010084970 | 9/2001 |
| KR | 100492794 | 5/2005 |
| KR | 1020050101867 | 10/2005 |

* cited by examiner

Primary Examiner—An T. Luu
(74) Attorney, Agent, or Firm—Lowe Hauptman Ham & Berner, LLP

(57) ABSTRACT

An internal voltage generator that generates an internal voltage for a Delay Locked Loop (DLL) and an internal clock generator including the same, and an internal voltage generating method for a DLL. The internal voltage generator includes a standby voltage generator that generates the DLL internal voltage as a reference voltage level, a controller that generates an active control signal in response to a power-down signal and an active signal, and an active voltage generator that generates the DLL internal voltage of the reference voltage level in response to the active control signal. After the power-down mode is ended, the active voltage generator is additionally operated during a predetermined time when the DLL is initially enabled. It is therefore possible to generate stabilized DLL internal voltages.

19 Claims, 7 Drawing Sheets

INTERNAL VOLTAGE GENERATOR AND INTERNAL CLOCK GENERATOR INCLUDING THE SAME, AND INTERNAL VOLTAGE GENERATING METHOD THEREOF

BACKGROUND

1. Field of the Invention

The present invention generally relates to semiconductor memory devices, and more particularly, to an internal voltage generator that generates an internal voltage for a Delay Locked Loop (DLL) and an internal clock generator including the same, and an internal voltage generating method for a DLL.

2. Discussion of Related Art

In general, semiconductor memory devices that operate in synchronization with a clock signal, such as synchronous semiconductor memory devices, include an internal clock generator that receives an external clock signal and generates an internal clock signal. The internal clock generator may be implemented in various manners. A DLL that can control a delay amount of the internal clock signal accurately is generally used for the internal clock generator.

Meanwhile, the DLL uses a DLL internal voltage which is generated by the DLL internal voltage generator as its operating voltage. For the purpose of an accurate operation of the DLL, it is important for the internal voltage generator to generate a stabilized DLL internal voltage.

FIG. 1 is a schematic block diagram of a DLL and a DLL internal voltage generator in the related art.

Referring to FIG. 1, the internal voltage generator 10 includes an active voltage generator 11 and a standby voltage generator 12. A DLL 20 uses an internal voltage VD1, which is generated by the active voltage generator 11 or the standby voltage generator 12, as an operating voltage.

The active voltage generator 11 operates only during an active period of a semiconductor memory device (for example, during a data access period of a semiconductor memory device) in response to an active signal ACT_FLG. Accordingly, the active voltage generator 11 strops its operation while the active signal ACT_FLG is disabled.

Meanwhile, the standby voltage generator 12 always operates without regard to the active period of the semiconductor memory device. In general, the standby voltage generator 12 is implemented using circuits with low current consumption in comparison with the active voltage generator 11 in order to save current consumption in the standby state.

In the case where the current consumption amount of the semiconductor memory device must be minimized as in a power-down mode or a self refresh mode, the standby voltage generator 12 functions to sustain the internal voltage VD1 to a set voltage (i.e., a reference voltage (VREF) level while consuming a minimum current.

In the active period in which variation in the amount of an internal power supply of the semiconductor memory device is great and a current consumption amount is high due to frequent operations of the DLL 20 (i.e., the access period of the semiconductor memory device in which the read or write operation is executed), however, the standby voltage generator 12 cannot sustain the internal voltage VD1 to the reference voltage (VREF) level. As a result, if only the standby voltage generator 12 operates in the active period, the internal voltage VD1 abruptly reduces. To prevent the problem, the internal voltage generator 10 includes the active voltage generator 11 that further generates the internal voltage VD1 in the active period in order to stabilize the internal voltage VD1.

Meanwhile, the semiconductor memory device enters the power-down mode during the period in which it does not actually operate in order to save current consumption. At this time, a time which is taken for the DLL internal voltage VD1 to restore to the reference voltage (VREF) level after the semiconductor memory device exits the power-down mode may be varied depending on the operating state of the semiconductor memory device immediately before entering the power-down mode. This will be described in more detail below.

For example, in the case where the semiconductor memory device enters from the active state to the power-down mode, the internal voltage generator 10 maintains its operating state immediately before the power-down mode when the semiconductor memory device exits the power-down mode. That is, since it is immediately before entering the power-down mode (i.e., the semiconductor memory device is in the active state (i.e., both the active voltage generator 11 and the standby voltage generator 12 operate)), both the active voltage generator 11 and the standby voltage generator 12 operate even after the semiconductor memory device exits the power-down mode. As a result, the internal voltage VD1 can be rapidly stabilized to the reference voltage (VREF) level.

In the case where the semiconductor memory device enters from a precharge state (i.e., a state where the read or write operation is not performed) to the power-down mode, a time which is taken for the internal voltage VD1 to be stabilized to the reference voltage (VREF) level is significantly longer than that of the case described above when the semiconductor memory device exits the power-down mode. This is because in the precharge state of the semiconductor memory device immediately before entering the power-down mode, only the standby voltage generator 12 operates in order to save current consumption, and only the standby voltage generator 12 operates even immediately after the semiconductor memory device exits the power-down mode.

The standby voltage generator 12 is implemented using circuits with less current consumption compared with the active voltage generator 11 as described above. Therefore, the standby voltage generator 12 has less ability to restore the internal voltage VD1 to the reference voltage (VREF) level in comparison with the active voltage generator 11. In other words, the response speed of the standby voltage generator 12 to variation in the internal voltage VD1 is slower than that of the active voltage generator 11.

Furthermore, the current driving ability of the standby voltage generator 12 is smaller than that of the active voltage generator 11. Accordingly, when the semiconductor memory device enters from the precharge state to the power-down mode rather than when the semiconductor memory device enters from the active state to the power-down mode, a time which is taken for the internal voltage VD1 to be stabilized to the reference voltage (VREF) level right after the power-down mode is longer.

On the other hand, the DLL 20 stops the operation of generating the internal clock signals DCK, DCKB in the power-down mode in order to save current consumption, and begins the operation of generating internal clock signals DCK, DCKB after exiting the power-down mode. As a result, when the DLL 20 begins operating right after the semiconductor memory device exits the power-down mode, current consumption of the DLL 20 is abruptly increased and the internal voltage VD1 is abruptly reduced (i.e., the internal voltage VD1 is fluctuated).

At this time, if only the standby voltage generator 12 operates, the internal voltage VD1 can restore to the reference voltage (VREF) level more rapidly. When the DLL 20 begins operating, the internal voltage VD1 is not restored to a given level rapidly. Accordingly, a problem arises because the DLL 20 cannot operate normally. This problem may become worse when the current consumption amount of the DLL 20 is the greatest (i.e., when the number of unit delay units that operate actually is the largest because the delay time of the DLL 20 is set to the greatest) right before the DLL 20 is disabled. This is because when the DLL 20 is enabled again, the DLL 20 operates at a delay time set in the previous operation. Accordingly, as the delay time set in the previous operation is increased, the level of the internal voltage VD1 when the DLL 20 is enabled is further decreased.

To prevent the problem, another example of the DLL internal voltage generator in which the level of an internal voltage VD2 is forcedly increased during a predetermined time when the DLL 20 is enabled is shown in FIG. 2.

Referring to FIG. 2, a PMOS transistor 40 operating as a pull-up circuit is connected to an output node NOUT of a DLL internal voltage generator 30. The PMOS transistor 40 supplies the output node NOUT with a power supply voltage VDD in response to a control signal EXTP which is disabled for a predetermined time when the DLL 20 is enabled. As a result, the level of the internal voltage VD2 output to the output node NOUT by the DLL internal voltage generator 30 is forcedly increased.

However, the PMOS transistor 40 increases the internal voltage VD2 without regard to a current level of the internal voltage VD2. Accordingly, there is a problem in which an overshoot phenomenon is generated due to an excessive increase of the internal voltage VD2. Accordingly, there is a problem in that the DLL internal voltage generator 10 cannot sustain the DLL internal voltage VD1 or VD2 more stably when the DLL 20 is enabled after being disabled.

If the internal voltage VD1 is not rapidly stabilized to the reference voltage (VREF) level immediately after the semiconductor memory device exits the power-down mode, the DLL 20 cannot generate stabilized internal clock signals DCK, DCKB stably. Accordingly, a problem arises because the read or write operation of the semiconductor memory device, which will be executed later, is not normally performed.

SUMMARY OF THE INVENTION

An embodiment of the present invention is that it provides an internal voltage generator in which stabilized DLL internal voltages can be generated by additionally operating the active voltage generator for a predetermined time when the DLL is enabled after exiting the power-down mode.

Another embodiment of the present invention is that it provides an internal clock generator including the internal voltage generator in which stabilized DLL internal voltages can be generated by additionally operating the active voltage generator for a predetermined time when a DLL is enabled after exiting the power-down mode.

Further another embodiment of the present invention is that it provides an internal voltage generating method in which stabilized DLL internal voltages can be generated by additionally operating the active voltage generator for a predetermined time when a DLL is enabled after exiting the power-down mode.

According to an embodiment of the present invention, there is provided an internal voltage generator that generates an internal voltage for a DLL, the internal voltage generator including a standby voltage generator that generates the DLL internal voltage as a reference voltage level, a controller that generates an active control signal in response to a power-down signal and an active signal, and an active voltage generator that generates the DLL internal voltage of the reference voltage level in response to the active control signal.

According to another embodiment of the present invention, there is provided an internal clock generator of a semiconductor memory device, wherein the internal clock generator receives external clock signals and generates internal clock signals, the internal clock generator including an internal voltage generator that generates a stabilized DLL internal voltage kept to a predetermined voltage level, and a clock generator that uses the DLL internal voltage as an operating voltage and generates the internal clock signals based on the external clock signals in response to a power-down signal.

According to further another embodiment of the present invention, there is provided an internal voltage generating method in which a DLL internal voltage used as an operating voltage of a DLL is generated, the internal voltage generating method including the steps of allowing a standby voltage generator to generate the DLL internal voltage as a reference voltage level, generating an active control signal in response to a power-down signal and an active signal, and allowing an active voltage generator to generate the DLL internal voltage of the reference voltage level additionally in response to the active control signal.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The present invention will now be described in detail in connection with certain exemplary embodiments with reference to the accompanying drawings.

Figure 1:
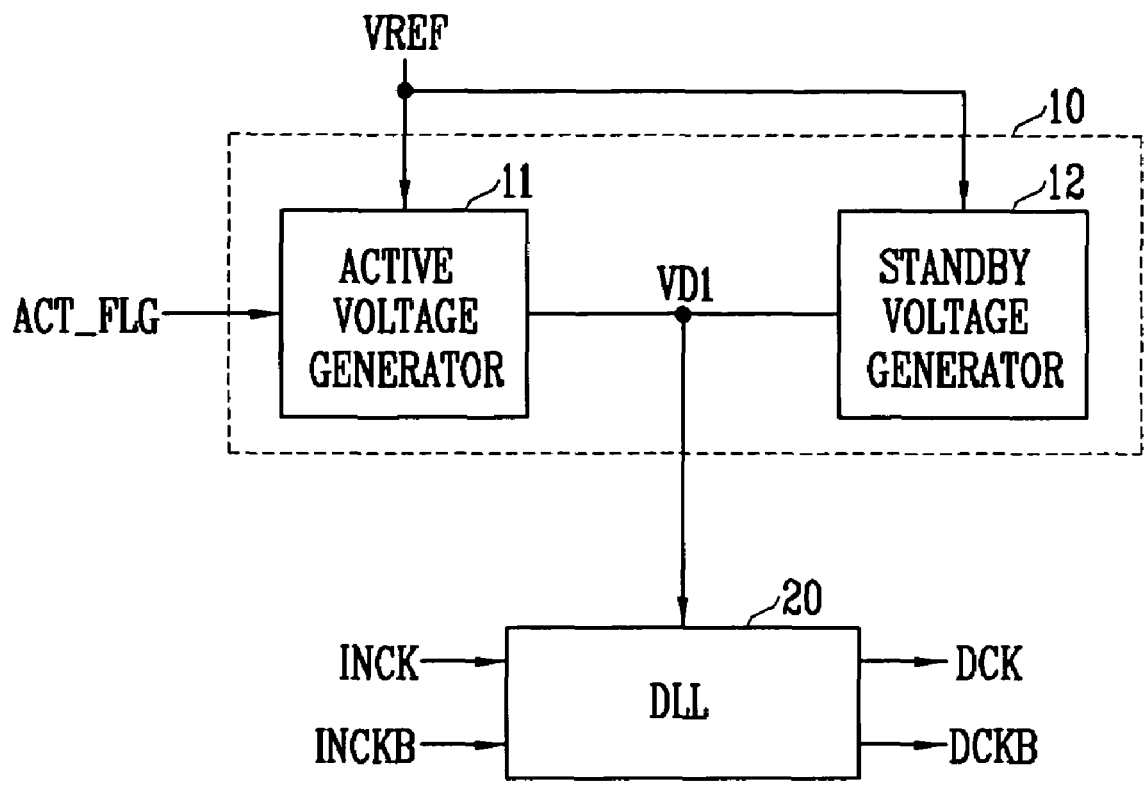
FIG. 1 is a schematic block diagram of a DLL and a DLL internal voltage generator in the related art.
Figure 2:
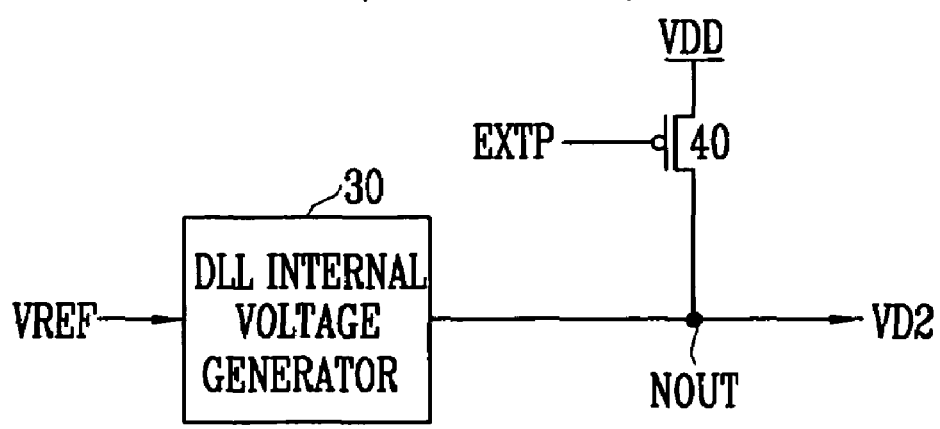
FIG. 2 is a circuit diagram illustrating another example of the DLL internal voltage generator in the related art.
Figure 3:
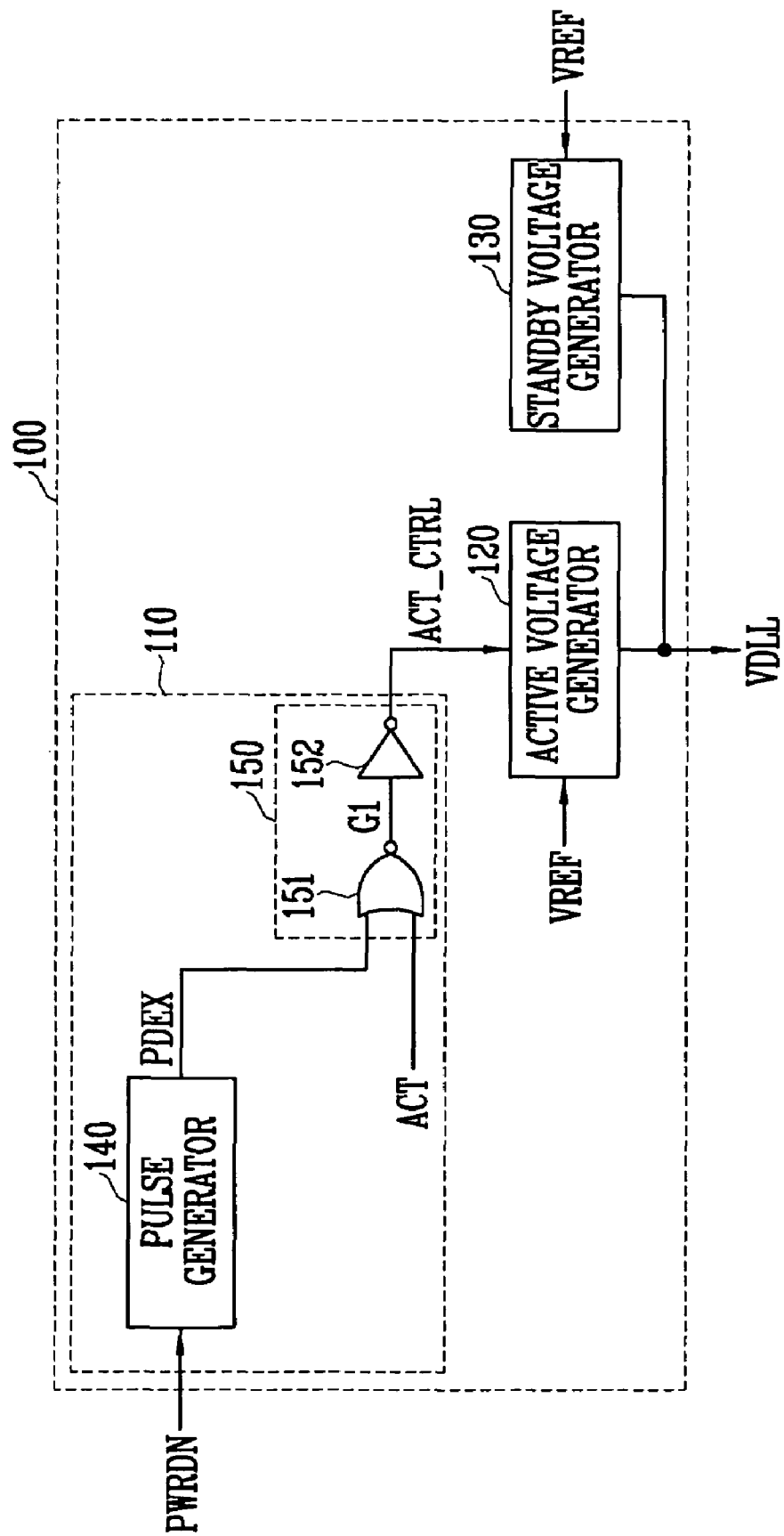
FIG. 3 is a circuit diagram of a DLL internal voltage generator according to an embodiment of the present invention.

FIG. 3 is a circuit diagram of a DLL internal voltage generator according to an embodiment of the present invention.

Referring to FIG. 3, the internal voltage generator 100 includes a controller 110, an active voltage generator 120, and a standby voltage generator 130.

Figure 4:
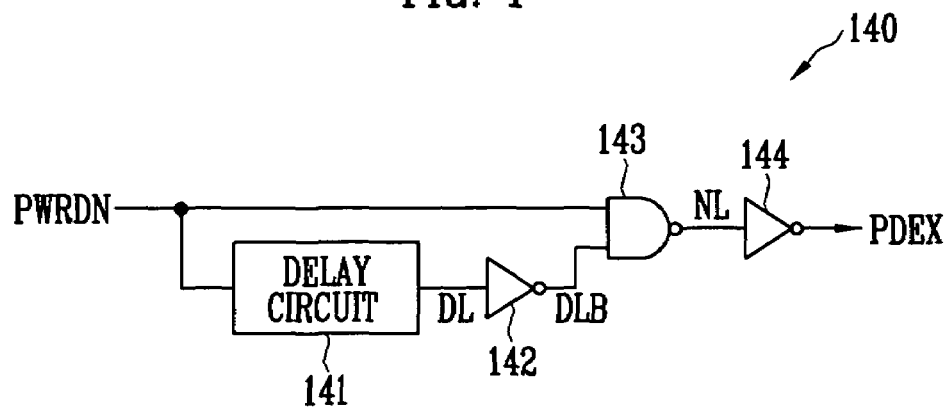
FIG. 4 is a detailed circuit diagram of a pulse generator shown in FIG. 3 according to an embodiment of the present invention.

The controller 110 generates an active control signal ACT_CTRL in response to a power-down signal PWRDN and an active signal ACT. The power-down signal PWRDN may be enabled in the power-down mode of the DLL and may be disabled when the DLL exits the power-down mode. The controller 110 includes a pulse generator 140 and an output logic circuit 150. The pulse generator 140 generates a control pulse signal PDEX based on the power-down signal PWRDN. The construction and detailed operation of the pulse generator 140 will be described below with reference to FIG. 4.

The pulse generator 140 includes a delay circuit 141, inverters 142, 144, and a NAND gate 143.

The delay circuit 141 delays the power-down signal PWRDN for a predetermined time (T1) and outputs a delay signal DL. The delay circuit 141 may be implemented using a plurality of inverters (not shown) connected in series and the predetermined time (T1) may be increased or decreased, if appropriate.

The inverter 142 inverts the delay signal DL and outputs an inverted delay signal DLB. The NAND gate 143 outputs an internal logic signal NL in response to the power-down signal PWRDN and the inverted delay signal DLB. During a time (T2) at which both the power-down signal PWRDN and the inverted delay signal DLB are logical high, the NAND gate 143 may output the internal logic signal NL as a logical low.

The inverter 144 inverts the internal logic signal NL and outputs an inverted signal as a control pulse signal PDEX. As a result, the pulse generator 140 outputs the control pulse signal PDEX, which is enabled during the time (T2) when the power-down signal PWRDN is disabled, as can be seen from FIG. 5.

Referring back to FIG. 3, the output logic circuit 150 includes a NOR gate 151 and an inverter 152.

The NOR gate 151 outputs an internal logic signal G1 in response to the control pulse signal PDEX and the active signal ACT. When the control pulse signal PDEX is received or the active signal ACT is enabled, the NOR gate 151 outputs the internal logic signal G1 as a logical low. The inverter 152 inverts the internal logic signal G1 and outputs an inverted signal as the active control signal ACT_CTRL.

Figure 5:
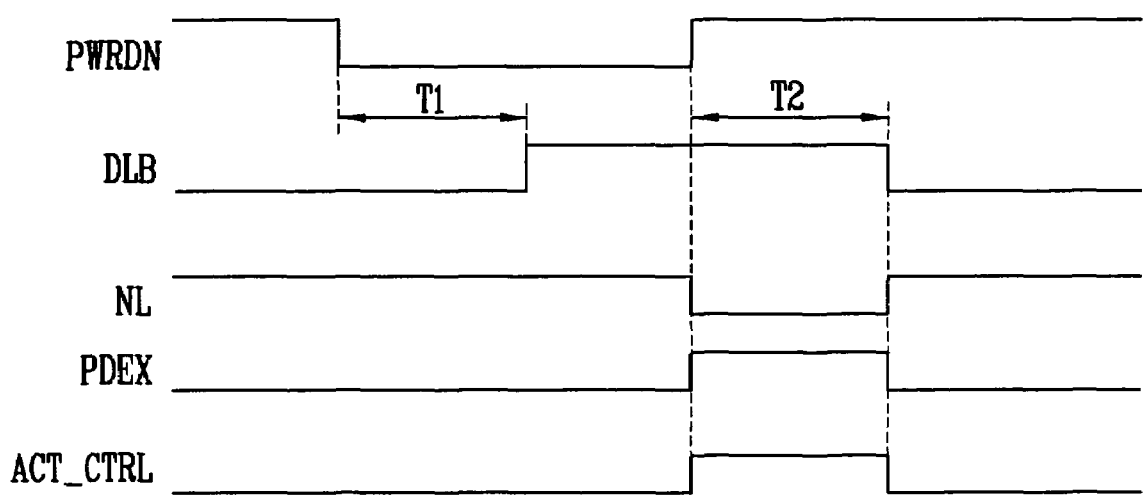
FIG. 5 is a timing diagram illustrating signals related to the operation of the pulse generator shown in FIG. 4 according to an embodiment of the present invention.

As a result, the output logic circuit 150 enables the active control signal ACT_CTRL for the predetermined time (T2) when the control pulse signal PDEX is received (i.e., when the control pulse signal PDEX is a logical high), as can be seen from FIG. 5. Furthermore, when the active signal ACT is enabled, the output logic circuit 150 enables the active control signal ACT_CTRL.

The active voltage generator 120 may be enabled or disabled in response to the active control signal ACT_CTRL. When the active voltage generator 120 is enabled, it generates a DLL internal voltage VDLL as a reference voltage (VREF) level. Furthermore, the standby voltage generator 130 always keeps enabled.

The standby voltage generator 130 generates the DLL internal voltage VDLL as the reference voltage (VREF) level in a similar way as the active voltage generator 120. The construction and detailed operation of each of the active voltage generator 120 and the standby voltage generator 130 will be described in more detail below with reference to FIG. 6.

Figure 6:
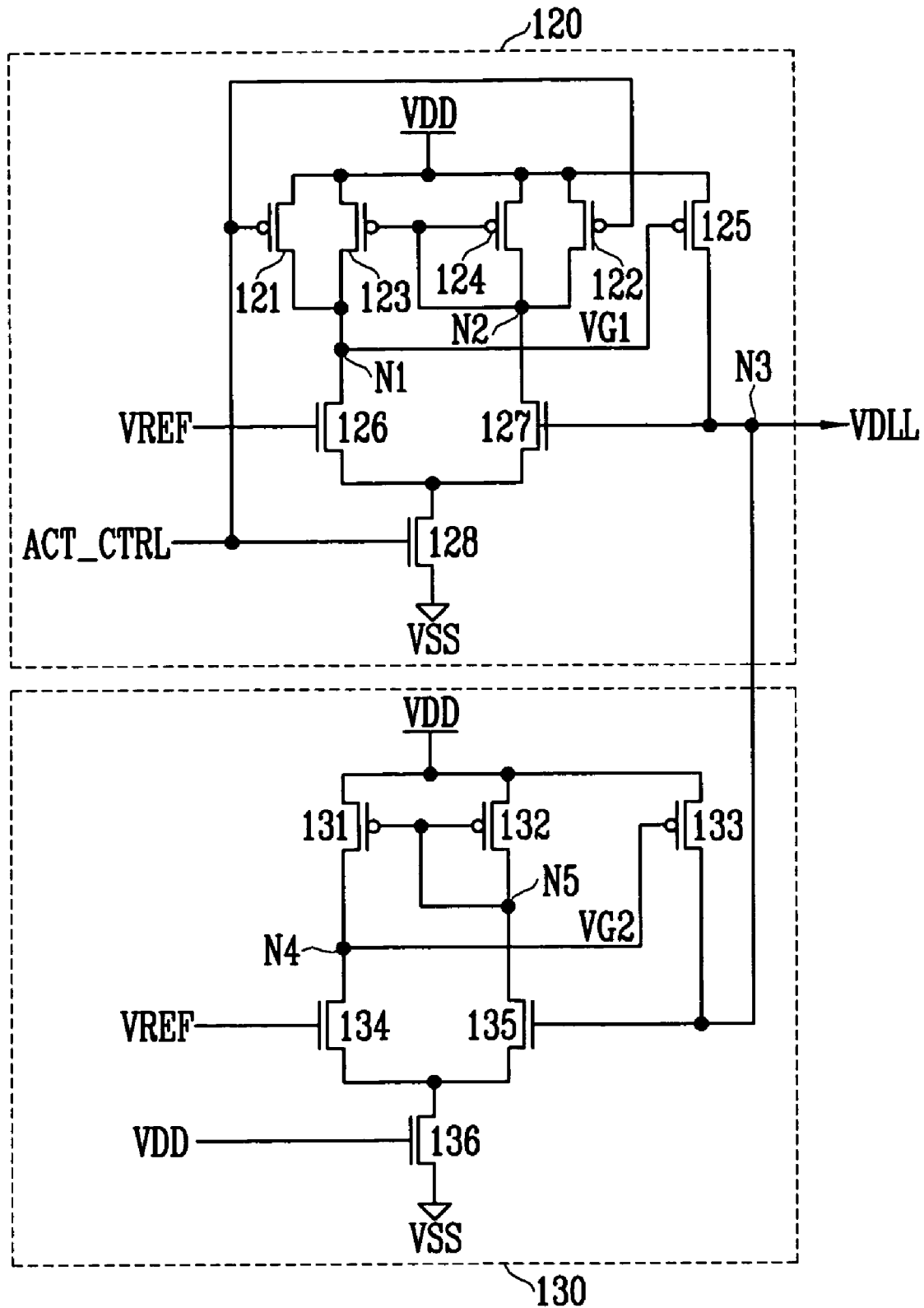
FIG. 6 is a detailed circuit diagram of an active voltage generator and a standby voltage generator shown in FIG. 3 according to an embodiment of the present invention.

Each of the active voltage generator 120 and the standby voltage generator 130 may be implemented using a comparator such as a differential amplifier. FIG. 6 shows an example in which each of the active voltage generator 120 and the standby voltage generator 130 is implemented using a differential amplifier.

The active voltage generator 120 may be enabled or disabled in response to the active control signal ACT_CTRL. The active voltage generator 120 includes PMOS transistors 121 to 125 and NMOS transistors 126 to 128.

The PMOS transistors 121, 123 are connected in parallel between a power supply voltage VDD and a node N1. The PMOS transistors 122, 124 are connected in parallel between the power supply voltage VDD and a node N2. The PMOS transistors 121, 122 have gates to which the active control signal ACT_CTRL is inputted. The PMOS transistors 121, 122 are turned on when the active control signal ACT_CTRL is disabled and accordingly supply the power supply voltage VDD to the nodes N1, N2.

Furthermore, the PMOS transistors 123, 124 have gates connected to the node N2. Therefore, the PMOS transistors 123, 124 are turned on or off in response to a voltage of the node N2. The PMOS transistor 125 has a gate connected to the node N1. The PMOS transistor 125 is turned on or off in response to a voltage VG1 of the node N1. The PMOS transistor 125 supplies the power supply voltage VDD to an output node N3 when being enabled, so that the DLL internal voltage VDLL is generated to the output node N3. As a result, the PMOS transistor 125 operates as a driver that generates the DLL internal voltage VDLL.

The NMOS transistor 126 has a drain connected to the node N1 and a gate to which the reference voltage VREF is inputted. The NMOS transistor 127 has a drain connected to the node N2 and a gate connected to the output node N3. Furthermore, the NMOS transistor 128 has a drain connected to sources of the NMOS transistors 126, 127, a source connected to a ground voltage VSS, and a gate to which the active control signal ACT_CTRL is inputted. The NMOS transistor 128 is turned on when the active control signal ACT_CTRL is enabled, so that the active voltage generator 120 is enabled.

When being enabled, the active voltage generator 120 compares the DLL internal voltage VDLL of the output node N3 and the reference voltage VREF, changes the voltage VG1 according to the comparison result, thereby controlling the operation of the PMOS transistor 125. Accordingly, the DLL internal voltage VDLL can be regulated to the reference voltage (VREF) level.

The standby voltage generator 130 includes PMOS transistors 131 to 133 and NMOS transistors 134 to 136. The PMOS transistor 131 is connected between the power supply voltage VDD and a node N4. The PMOS transistor 132 is connected between the power supply voltage VDD and a node N5. Furthermore, the PMOS transistors 131, 132 have gates connected to the node N5.

The PMOS transistor 133 is connected between the power supply voltage VDD and the output node N3 and has a gate connected to the node N4. Therefore, the PMOS transistor 133 is turned on or off in response to a voltage VG2 of the node N4. The PMOS transistor 133 supplies the power supply voltage VDD to the output node N3 when being turned on, so that the DLL internal voltage VDLL is generated to the output node N3. As a result, the PMOS transistor 133 operates as a driver that generates the DLL internal voltage VDLL.

The NMOS transistor 134 has a drain connected to the node N4 and a gate to which the reference voltage VREF is inputted. Furthermore, the NMOS transistor 135 has a drain connected to the node N5 and a gate connected to the output node N3. The NMOS transistor 136 has a drain connected to sources of the NMOS transistors 134, 135, a source connected to the ground voltage VSS, and a gate to which the power supply voltage VDD is inputted. Consequently, the NMOS transistor 136 remains turned on and the standby voltage generator 130 always remains enabled.

The standby voltage generator 130 compares the DLL internal voltage VDLL of the output node N3 and the reference voltage VREF and changes the voltage VG2 according to the comparison result, thereby controlling the operation of the PMOS transistor 133. Accordingly, the DLL internal voltage VDLL can be regulated to the reference voltage (VREF) level. The operation of the internal voltage generator 100 will be described in more detail below.

For example, the operation of the internal voltage generator 100 will be described when the internal voltage generator 100 is applied to the semiconductor memory device. Furthermore, in the present embodiment, the operation of the internal voltage generator 100 will be described as an example in which the semiconductor memory device enters from the precharge state to the power-down mode and then exits the power-down mode.

While the semiconductor memory device is in the power-down mode (i.e., during a period in which the DLL does not actually operate), the power-down signal PWRDN is enabled. Furthermore, in the power-down mode, the active signal ACT is disabled. Since the power-down signal PWRDN is enabled and the active signal ACT is disabled, the controller 110 keeps disabled the active control signal ACT_CTRL. As a result, the active voltage generator 120 is disabled.

On the other hands, since the standby voltage generator 130 is always enabled, it compares the DLL internal voltage VDLL and the reference voltage VREF and regulates the DLL internal voltage VDLL to the reference voltage (VREF) level according to the comparison results. As a result, the DLL internal voltage VDLL is kept to the reference voltage (VREF) level by the standby voltage generator 130.

Thereafter, when the semiconductor memory device exits the power-down mode (i.e., when the DLL exits the power-down mode), the power-down signal PWRDN is disabled. At this time, the controller 110 enables the active control signal ACT_CTRL for a predetermined time in response to the power-down signal PWRDN.

Therefore, the active voltage generator 120 is enabled during the predetermined time in response to the active control signal ACT_CTRL, so that the DLL internal voltage VDLL is generated additionally. As a result, when the DLL exits the power-down mode and then begins operating, the internal voltage generator 100 can restore the DLL internal voltage VDLL to the reference voltage (VREF) level rapidly although the current consumption of the DLL is increased.

As described above, the internal voltage generator 100 can operate the active voltage generator 120 additionally along with the standby voltage generator 130 when the DLL exits the power-down mode and then begins operating. Therefore, the DLL internal voltage VDLL can be prevented from abruptly falling and the DLL internal voltage VDLL can be maintained stably.

Figure 7:
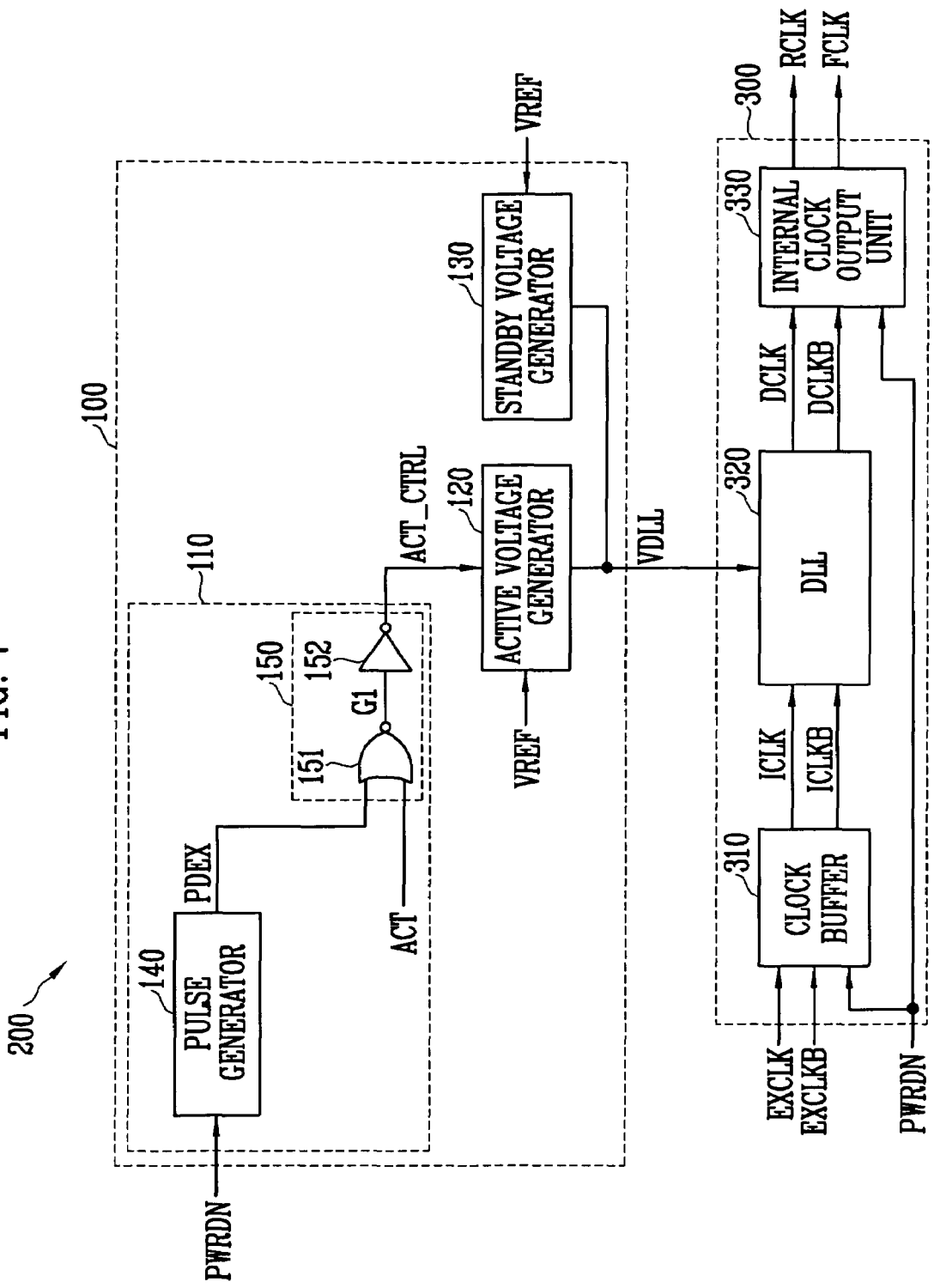
FIG. 7 is a circuit diagram of an internal clock generator according to an embodiment of the present invention.

FIG. 7 is a circuit diagram of an internal clock generator according to an embodiment of the present invention.

Referring to FIG. 7, the internal clock generator 200 includes an internal voltage generator 100 and a clock generator 300. The construction and operation of the internal voltage generator 100 are substantially the same as those of the internal voltage generator shown in FIG. 3. Description thereof will be omitted.

The clock generator 300 includes a clock buffer 310, a DLL 320, and an internal clock output unit 330.

The clock buffer 310 receives external clock signals EXCLK, EXCLKB in response to a power-down signal PWRDN and outputs inputted clock signals ICLK, ICLKB.

In more detail, the clock buffer 310 is enabled or disabled in response to the power-down signal PWRDN. When the power-down signal PWRDN is disabled (i.e., when the DLL 320 exits the power-down mode), the clock buffer 310 may be enabled. When being enabled, the clock buffer 310 receives the external clock signals EXCLK, EXCLKB and outputs the inputted clock signals ICLK, ICLKB.

Figure 8:
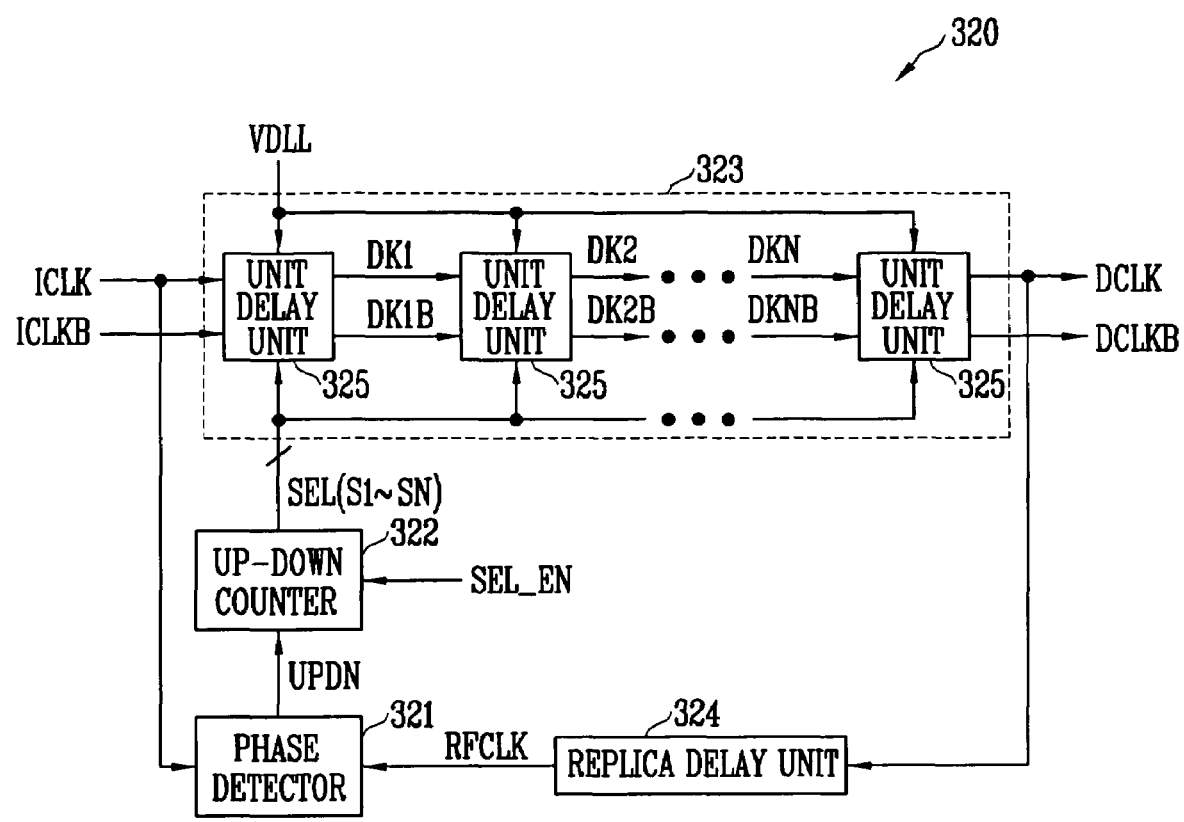
FIG. 8 is a detailed circuit diagram of a DLL shown in FIG. 7 according to an embodiment of the present invention.

The DLL 320 uses a DLL internal voltage VDLL, which is generated from the internal voltage generator 100, as an operating voltage. The DLL 320 delays the inputted clock signals ICLK, ICLKB and outputs delay clock signals DCLK, DCLKB. The construction and operation of the DLL 320 will be described in more detail below with reference to FIG. 8.

The DLL 320 includes a phase detector 321, an up-down counter 322, a delay circuit 323, and a replica delay unit 324. Furthermore, the delay circuit 323 includes a plurality of unit delay units 325 that are connected in series.

The phase detector 321 detects a phase difference between the inputted clock signal ICLK and the reference clock signal RFCLK and outputs a detection signal UPDN according to the detection results.

The up-down counter 322 performs an up or down counting operation in response to the detection signal UPDN and a counting control signal SEL_EN, and outputs a selection control signal SEL including bits S1 to SN (N is an integer) based on an accumulated counting value. Preferably, the number of unit delay units that are enabled in the delay circuit 323 is decided depending on a bit value of the selection control signal SEL. As a result, during the delay time by the enabled unit delay units, the delay circuit 323 delays the inputted clock signals ICLK, ICLKB and outputs delayed clock signals DCLK, DCLKB.

The replica delay unit 324 delays the delay clock signal DCLK and outputs the reference clock signal RFCLK. A detailed operation of the DLL 320 will be evident to those skilled in the art. Description thereof will be omitted.

Referring back to FIG. 7, the internal clock output unit 330 is enabled or disabled in response to the power-down signal PWRDN. Preferably, when the power-down signal PWRDN is disabled (i.e., when the DLL 320 exits the power-down mode), the internal clock output unit 330 is enabled. When the internal clock output unit 330 is enabled, it outputs internal clock signals RCLK, FCLK based on the delay clock signals DCLK, DCLKB.

Figure 9:
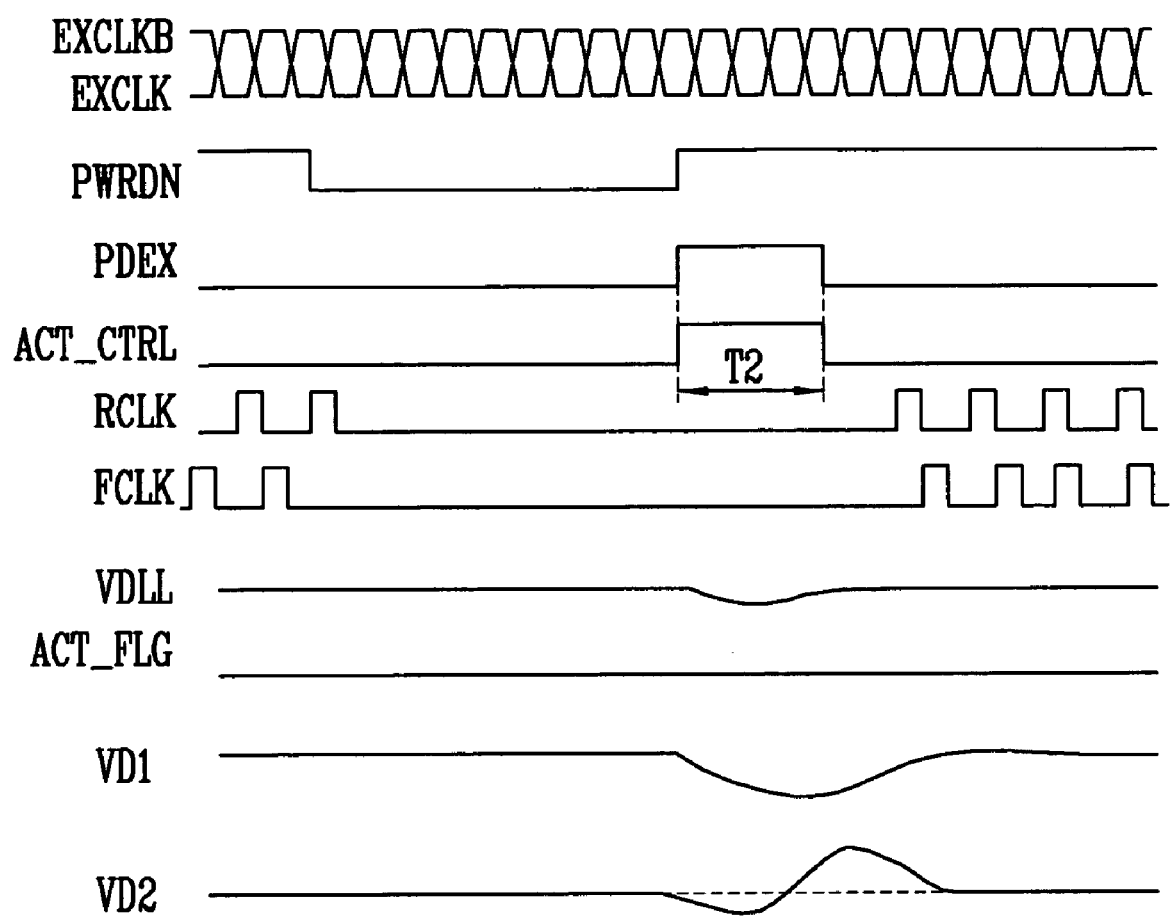
FIG. 9 is a timing diagram illustrating signals related to the operation of the internal clock generator shown in FIG. 7, and illustrates waveforms of the internal voltages generated by the internal voltage generators shown in FIGS. 1, 2 and 7 according to an embodiment of the present invention.

The operation of the internal clock generator 200 will be described simply with reference to FIG. 9. For example, the operation of the internal clock generator 200 will be described in the case where the internal clock generator 200 is applied to a semiconductor memory device. Furthermore, in the present embodiment, the operation of the internal clock generator 200 will be described as an example when the semiconductor memory device enters from the precharge state to the power-down mode and then exits the power-down mode.

While the semiconductor memory device is in the power-down mode (i.e., during the period in which the DLL does not operate actually), the power-down signal PWRDN is enabled. Furthermore, in the power-down mode, the active signal ACT is disabled. Since the power-down signal PWRDN is enabled and the active signal ACT is disabled, the controller 110 maintains the active control signal ACT_CTRL to a disable state. As a result, the active voltage generator 120 is disabled.

Meanwhile, since the standby voltage generator 130 is always enabled, it compares the DLL internal voltage VDLL and the reference voltage VREF and regulates the DLL internal voltage VDLL to the reference voltage (VREF) level depending on the comparison result. Accordingly, the DLL internal voltage VDLL is kept to the reference voltage (VREF) level by the standby voltage generator 130.

Thereafter, when the semiconductor memory device exits the power-down mode (i.e., when the DLL 320 exits the power-down mode), the power-down signal PWRDN is disabled. At this time, the controller 110 enables the active control signal ACT_CTRL during the time (T2) in response to the power-down signal PWRDN.

The active voltage generator 120 is enabled in response to the active control signal ACT_CTRL during the time (T2) and generates the DLL internal voltage VDLL additionally. As a result, when the DLL 320 exits the power-down mode, the DLL internal voltage (VDLL) level that has been temporally reduced can be restored to a stabilized voltage level rapidly. As a result, when the DLL 320 exits the power-down mode and then begins performing the operation of generating the internal clock signals RCLK, FCLK, the DLL internal voltage VDLL can be sustained stably. Accordingly, the DLL 320 can operate stably.

Furthermore, an access operation, such as a next read operation of a semiconductor memory device, can be performed stably by means of the stabilized operation of the DLL 320. As can be seen from the waveforms of the DLL internal voltages VD1, VD2 shown in FIG. 9, the related art internal voltage generator 10 cannot generate the DLL internal voltages VD1, VD2 stably when the DLL exits the power-down mode.

In other words, the DLL internal voltage VD1 does not restore to a stabilized level rapidly and decreases abruptly accordingly. In this case, the active voltage generator does not operate from when the semiconductor memory device exits the power-down mode to when access to data is performed. Accordingly, a long time is taken for the abruptly decreased DLL internal voltage VD1 to restore to a stabilized level.

As a result, since the DLL does not generate a stabilized internal clock signal, the internal circuits of the semiconductor memory device, which require the internal clock signals, may malfunction right after the power-down mode. Furthermore, since the DLL internal voltage VD2 is increased excessively, the overshoot phenomenon may occur.

As described above, in accordance with the DLL internal voltage generator and the internal voltage generating method thereof according to an embodiment of the present invention, after the power-down mode is ended, the active voltage generator is additionally operated during a predetermined time when the DLL is initially enabled. It is therefore possible to generate stabilized DLL internal voltages.

Furthermore, the internal clock generator including the DLL internal voltage generator according to an embodiment of the present invention exits the power-down mode and can operate stably when the DLL is initially enabled. Accordingly, a next access operation of a semiconductor memory device can be executed stably.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An internal voltage generator that generates an internal voltage for a Delay Locked Loop (DLL), the internal voltage generator comprising:

a standby voltage generator that generates the internal voltage in response to a reference voltage level;

a pulse generator that generates a control pulse signal based on a power-down signal, the control pulse signal having a first level for a predetermined time from when the power-down signal is disabled after being enabled;

an output logic circuit that generates an active control signal in response to the control pulse signal and an active signal; and an active voltage generator that generates the internal voltage in response to the reference voltage level and the active control signal.

2. The internal voltage generator as claimed in claim 1, wherein the pulse generator comprises:

a delay circuit that delays the power-down signal for a predetermined time and outputs a delay signal;

a first inverter that inverts the delay signal and outputs an inverted delay signal;

a NAND gate that outputs an internal logic signal in response to the power-down signal and the inverted delay signal; and a second inverter that inverts the internal logic signal and outputs an inverted signal as the control pulse signal.

3. The internal voltage generator as claimed in claim 1, wherein the active voltage generator comprises a first comparator, which is enabled or disabled in response to the active control signal, compares the internal voltage with the reference voltage when the first comparator is enabled, and regulates the internal voltage to the reference voltage level according to the comparison result, and the standby voltage generator further comprises a second comparator which compares the internal voltage with the reference voltage and further regulates the internal voltage to the reference voltage level according to the comparison result.

4. The internal voltage generator as claimed in claim 3, wherein each of the first and second comparators is a differential amplifier.

5. An internal clock generator of a semiconductor memory device, wherein the internal clock generator receives external clock signals and generates internal clock signals, the internal clock generator comprising:

an internal voltage generator that generates a stabilized DLL internal voltage kept to a predetermined voltage level, wherein the internal voltage generator includes:

a standby voltage generator that generates the stabilized DLL internal voltage in response to a reference voltage level;

a pulse generator that generates a control pulse signal based on a power-down signal, the control pulse signal having a first level for a predetermined time from when the power-down signal is disabled after being enabled;

an output logic circuit that generates an active control signal in response to the control pulse signal and an active signal;

an active voltage generator that generates the stabilized DLL internal voltage in response to the reference voltage level and the active control signal; and a clock generator that uses the stabilized DLL internal voltage as an operating voltage and generates the internal clock signals based on the external clock signals in response to the power-down signal.

6. The internal clock generator as claimed in claim 5, wherein the pulse generator comprises:

a delay circuit that delays the power-down signal for a predetermined time and outputs a delay signal;

a first inverter that inverts the delay signal and outputs an inverted delay signal;

a NAND gate that outputs an internal logic signal in response to the power-down signal and the inverted delay signal; and a second inverter that inverts the internal logic signal and outputs an inverted signal as the control pulse signal.

7. The internal clock generator as claimed in claim 5, wherein the output logic circuit comprises:

a NOR gate that outputs an internal logic signal in response to the control pulse signal and the active signal; and an inverter that inverts the internal logic signal and outputs an inverted signal as the active control signal.

8. The internal clock generator as claimed in claim 5, wherein the active voltage generator comprises a first comparator, which is enabled or disabled in response to the active control signal, compares the DLL internal voltage with the reference voltage when the first comparator is enabled, and regulates the stabilized DLL internal voltage to the reference voltage level according to a comparison result, and the standby voltage generator further comprises a second comparator which compares the stabilized DLL internal voltage with the reference voltage and further regulates the stabilized DLL internal voltage to the reference voltage level according to a comparison result.

9. The internal clock generator as claimed in claim 8, wherein each of the first and second comparators is a differential amplifier.

10. The internal clock generator as claimed in claim 5, wherein the clock generator comprises:

a clock buffer that receives the external clock signals in response to the power-down signal and outputs inputted clock signals;

a DLL that uses the stabilized DLL internal voltage as an operating voltage, delays the inputted clock signals, and outputs delay clock signals; and an internal clock output unit that outputs the internal clock signals based on the delay clock signals in response to the power-down signal.

11. The internal clock generator as claimed in claim 10, wherein the clock buffer and the internal clock output unit are respectively enabled or disabled in response to the power-down signal.

12. An internal voltage generating method in which a DLL internal voltage used as an operating voltage of a DLL is generated, the internal voltage generating method comprising the steps of:

allowing a standby voltage generator to generate the DLL internal voltage in response to a reference voltage level;

generating an active control signal in response to a control pulse signal, a power-down signal and an active signal, the control pulse signal having a first level of a predetermined time from when the power-down signal is disabled after being enabled; and allowing an active voltage generator to generate the DLL internal voltage in response to the reference voltage level and the active control signal.

13. The internal voltage generating method as claimed in claim 12, wherein the power-down signal is enabled in a power-down mode of the DLL, and in the step of generating the active control signal, when the power-down signal is disabled or the active signal is enabled, the active control signal is enabled.

14. The internal voltage generating method as claimed in claim 12, wherein the step of generating the active control signal comprises the steps of:

generating a control pulse signal based on the power-down signal; and generating the active control signal in response to the control pulse signal and the active signal.

15. The internal voltage generating method as claimed in claim 14, wherein in the step of generating the control pulse signal, when the power-down signal is disabled, the control pulse signal is output for a predetermined time, and in the step of generating the active control signal, when the control pulse signal is output, the active control signal is enabled for the predetermined time, and when the active signal is enabled, the active control signal is enabled.

16. The internal voltage generating method as claimed in claim 14, wherein the step of generating the control pulse signal comprises the steps of:

delaying the power-down signal for a predetermined time and outputting a delay signal; inverting the delay signal and outputting an inverted delay signal;

outputting an internal logic signal in response to the power-down signal and the inverted delay signal; and inverting the internal logic signal and outputting an inverted signal as the control pulse signal.

17. The internal voltage generating method as claimed in claim 14, wherein the step of generating the active control signal comprises the steps of:

outputting an internal logic signal in response to the control pulse signal and the active signal; and inverting the internal logic signal and outputting an inverted signal as the active control signal.

18. The internal voltage generating method as claimed in claim 12, wherein the step of generating the DLL internal voltage comprises the steps of:

comparing the DLL internal voltage with the reference voltage; and regulating the DLL internal voltage to the reference voltage level according to a comparison result.

19. The internal voltage generating method as claimed in claim 12, wherein the step of generating the DLL internal voltage further comprises the steps of:

comparing the DLL internal voltage with the reference voltage in response to the active control signal; and regulating the DLL internal voltage to the reference voltage level according to a comparison result.

* * * * *